United States Patent
Mori et al.

(10) Patent No.: US 7,511,880 B2
(45) Date of Patent: Mar. 31, 2009

(54) SEMICONDUCTOR LIGHT SOURCE MODULE

(75) Inventors: Nobuyoshi Mori, Hachioji (JP); Katsuya Yagi, Hachioji (JP); Yuichi Atarashi, Hachioji (JP); Fumio Nagai, Hachioji (JP); David A. Loeber, Horseheads, NY (US); Jacques Gollier, Painted Post, NY (US); E. Alan Dowdell, Elmira, NY (US)

(73) Assignees: Konica Minolta Opto, Inc., Tokyo (JP); Corning Incorporated, Corning, NY (US)

( * ) Notice: Subject to any disclaimer, the term of this patent is extended or adjusted under 35 U.S.C. 154(b) by 59 days.

(21) Appl. No.: 11/545,470

(22) Filed: Oct. 11, 2006

(65) Prior Publication Data

US 2007/0091411 A1    Apr. 26, 2007

(30) Foreign Application Priority Data

Oct. 14, 2005   (JP)   ............................. 2005-300810
Oct. 14, 2005   (JP)   ............................. 2005-300811

(51) Int. Cl.
   *G02F 1/35*   (2006.01)
   *G02F 2/02*   (2006.01)
   *G02F 1/01*   (2006.01)

(52) U.S. Cl. ................. 359/328; 359/239; 359/326; 372/22

(58) Field of Classification Search ................. 359/237, 359/239, 326, 328; 372/21, 22
   See application file for complete search history.

(56) References Cited

U.S. PATENT DOCUMENTS

| | | | | |
|---|---|---|---|---|
| 5,063,568 A | * | 11/1991 | Chiba et al. | .................... 372/32 |
| 5,355,246 A | * | 10/1994 | Tanuma | ...................... 359/326 |
| 5,644,584 A | * | 7/1997 | Nam et al. | ..................... 372/20 |
| 6,496,299 B2 | * | 12/2002 | Yamamoto et al. | .......... 359/328 |
| 6,590,915 B1 | * | 7/2003 | Kitaoka et al. | ........... 372/38.02 |
| 7,233,608 B2 | * | 6/2007 | Zemmouri et al. | ............ 372/32 |

* cited by examiner

*Primary Examiner*—Sung Pak
*Assistant Examiner*—Daniel Petkovsek
(74) *Attorney, Agent, or Firm*—Finnegan, Henderson, Farabow, Garrett & Dunner, L.L.P.

(57) ABSTRACT

The present invention provides a semiconductor light source module including: a semiconductor light source for emitting a light flux with a predefined wavelength; a SHG element for converting an incident light flux entering onto an incident end surface of the SHG element into an outgoing light flux having a different wavelength from the incident light flux; a light converging optical system for converging a light flux emitted from the semiconductor light source onto the incident end surface of the SHG element; a light receiving element for receiving a part of a light flux emitted from the SHG element; and a drive device for driving an optical element in the light converging optical system based on a light flux received by the light receiving element.

14 Claims, 11 Drawing Sheets

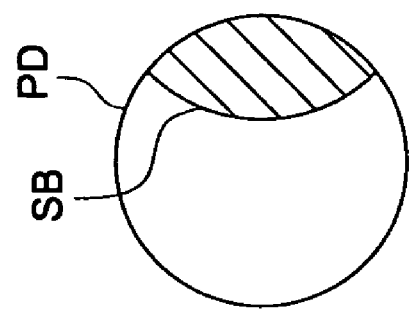
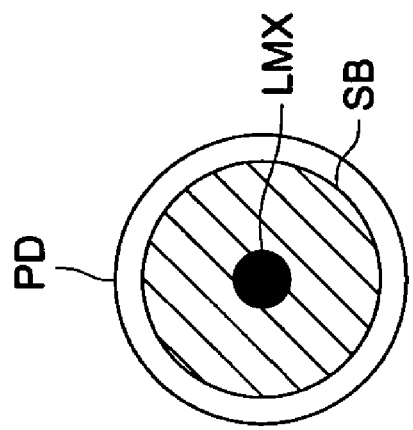
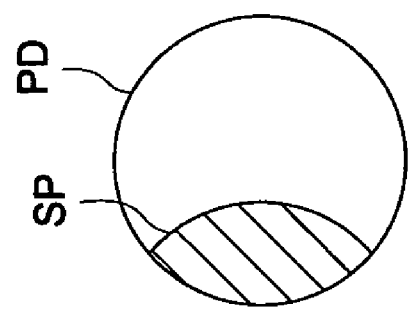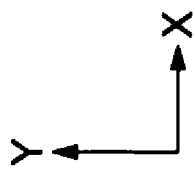
FIG. 8(a)   FIG. 8(b)   FIG. 8(c)

SEMICONDUCTOR LIGHT SOURCE MODULE

This application is based on Japanese Patent Application Nos. 2005-300810 filed on Oct. 14, 2005 and 2005-3000811 filed on Oct. 14, 2005, in Japanese Patent Office, the entire content of which is hereby incorporated by reference.

TECHNICAL FIELD

The present invention relates to a semiconductor light source module in which a convergent light flux is emitted to the end surface of an optical element including an optical fiber and SHG element.

BACKGROUND

One of the well-known modules is a semiconductor light source module that ensures that the laser beam emitted from a semiconductor laser is converged through a light converging optical system onto the end surface of an element such as an optical fiber and SHG element forming an optical transmission line. Since the aperture of an optical waveguide of a SHG element has a diameter (the diagonal length for a rectangular aperture) on the order of several μm, positioning the semiconductor laser, light converging optical system and SHG element mutually with high-precision is essential to improve the light use efficiency of the light to be converged as a spot light with high accuracy. However, even if these components are firmly fixed at the time of assembling, mutual positional relationship may deviate in response to the temperature change and other environmental change.

Japanese Non-Examined Patent Publication 1991-223727 (TOKUKAIHEI 3-223727) discloses the technique wherein a wavelength conversion element and a laser beam source are connected using a lens barrel whose thermal expansion coefficient is equal or approximate to the wavelength conversion element, whereby the influence of the temperature change is restricted. Further, Japanese Non-Examined Patent Publication 2003-338795 (TOKUKAI 2003-338795) describes the technique wherein, when a laser beam emitted from the semiconductor laser is converged onto the end surface of an optical transmission element through a light converging optical system, the light reflected from the end surface or the light passing through the optical transmission element is detected, and then, the light converging optical system is driven in the direction perpendicular to the optical axis, whereby the spot light is adequately converged onto the end surface of the optical transmission element.

However, in the Japanese Non-Examined Patent Publication 1991-223727, it is difficult to eliminate the effect of the temperature variation completely even by using a lens barrel whose thermal expansion coefficient is equal or approximate to the wavelength conversion element. Further, when a humidity variation, vibration or other factors has occurred, deviation in the positional relationship among the semiconductor laser, light converging optical system and SHG element may be caused. Further, in Japanese Non-Examined Patent Publication 2003-338795, the light converging optical system is driven to perform positioning by detection of the light reflected from the end surface or the light inside of the optical transmission element. It is difficult to apply this method to an element requiring high-precision positioning such as a SHG element. To be more specific, there is a possibility that the light reflected from the end surface may not be detected accurately when a figure tolerance of the end surface is not excellent, therefore, detecting light inside of SHG element may cause any trouble over wavelength conversion of a light flux which is primary function of the SHG element, in addition to the high-precision positioning.

SUMMARY

An object of the present invention is to solve the aforementioned problems of the conventional art and to provide a semiconductor light source module having excellent assembling properties, coping with the environmental variation, and providing higher light use efficiency by guiding accurately an emitted light flux from a light source into an end surface of a SHG element without affecting to wavelength conversion which is primary function of SHG element.

A semiconductor light source module according to the present invention includes: a semiconductor light source emitting a light flux with a predefined wavelength; a SHG element for converting an incident light flux into an outgoing light flux with a different wavelength from-the incident light flux; a light converging optical system converging a light flux emitted from the semiconductor light source onto the incident end surface of the SHG element; a light receiving element for receiving a part of a light flux emitted from the SHG element; and a drive device for driving an optical element in the light converging optical system based on a light flux received by the light receiving element.

BRIEF DESCRIPTION OF THE DRAWINGS

Embodiments will now be described, by way of example only, with reference to the accompanying drawings which are meant to be exemplary, not limiting, and wherein like elements numbered alike in several Figures, in which.

Figure 5:
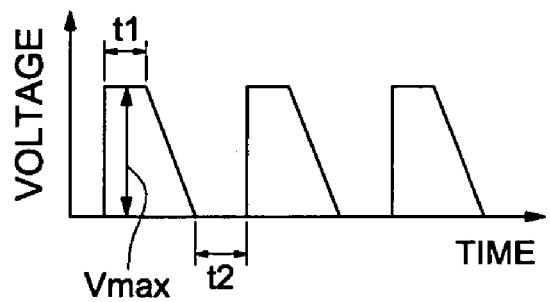
Figure 5:
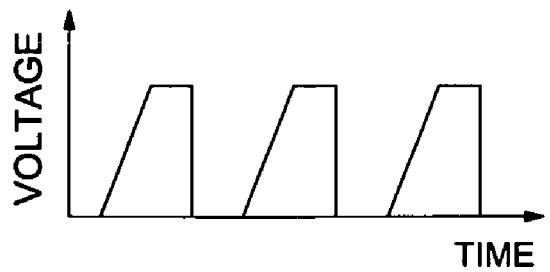
Figure 6:
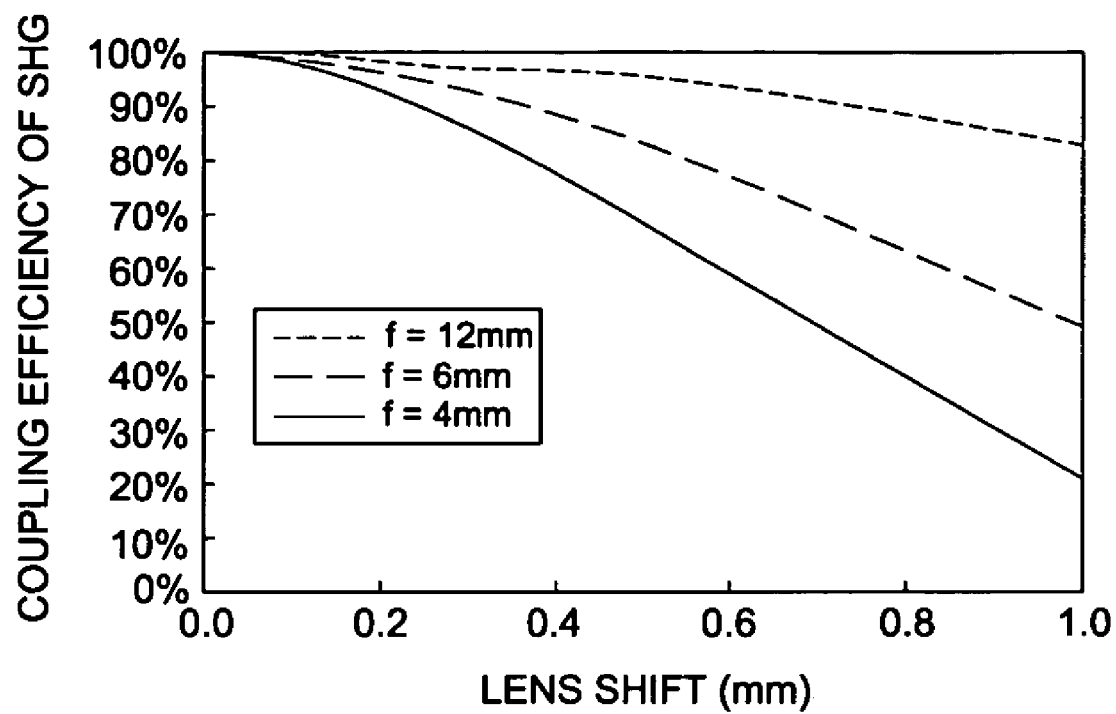
Figure 7:
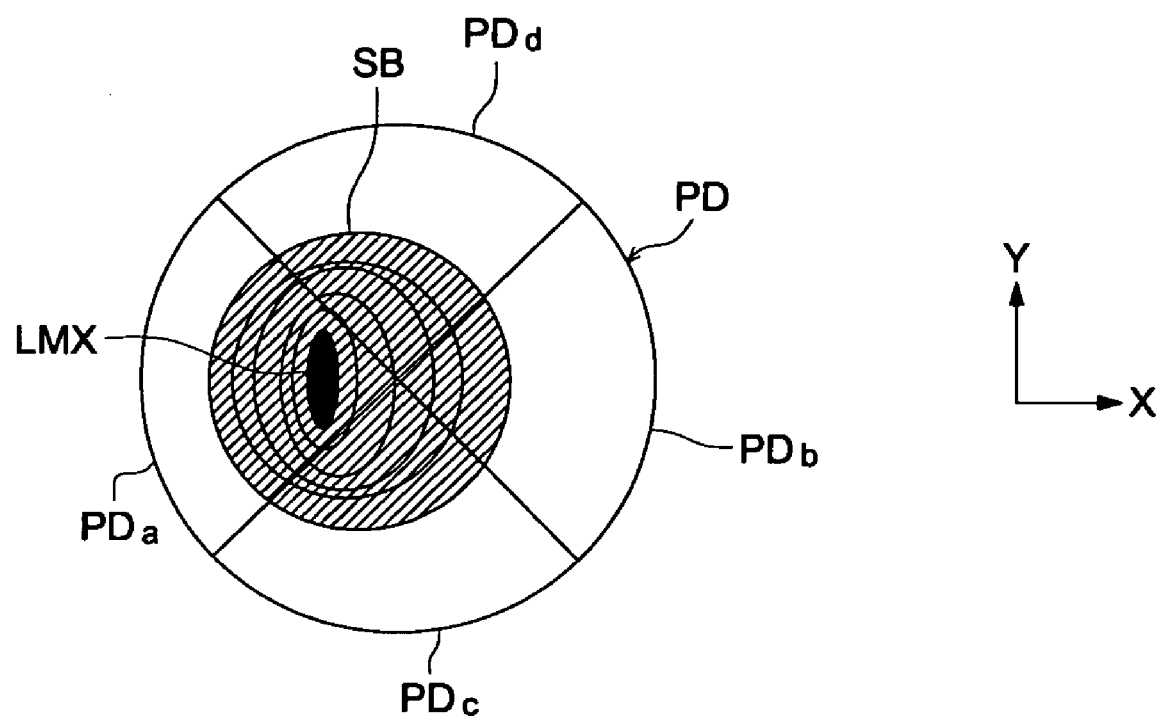
Figure 9:
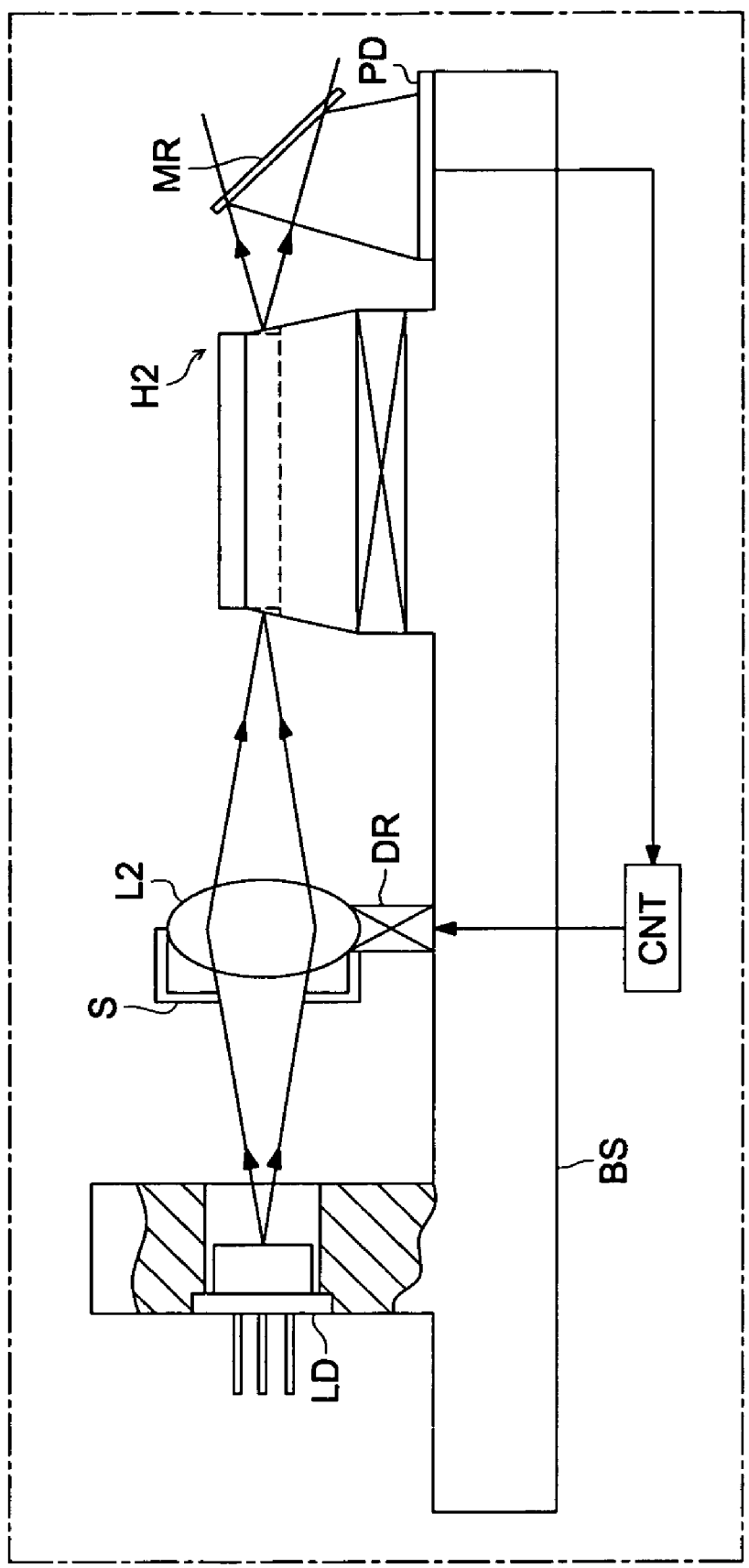
Figure 10:
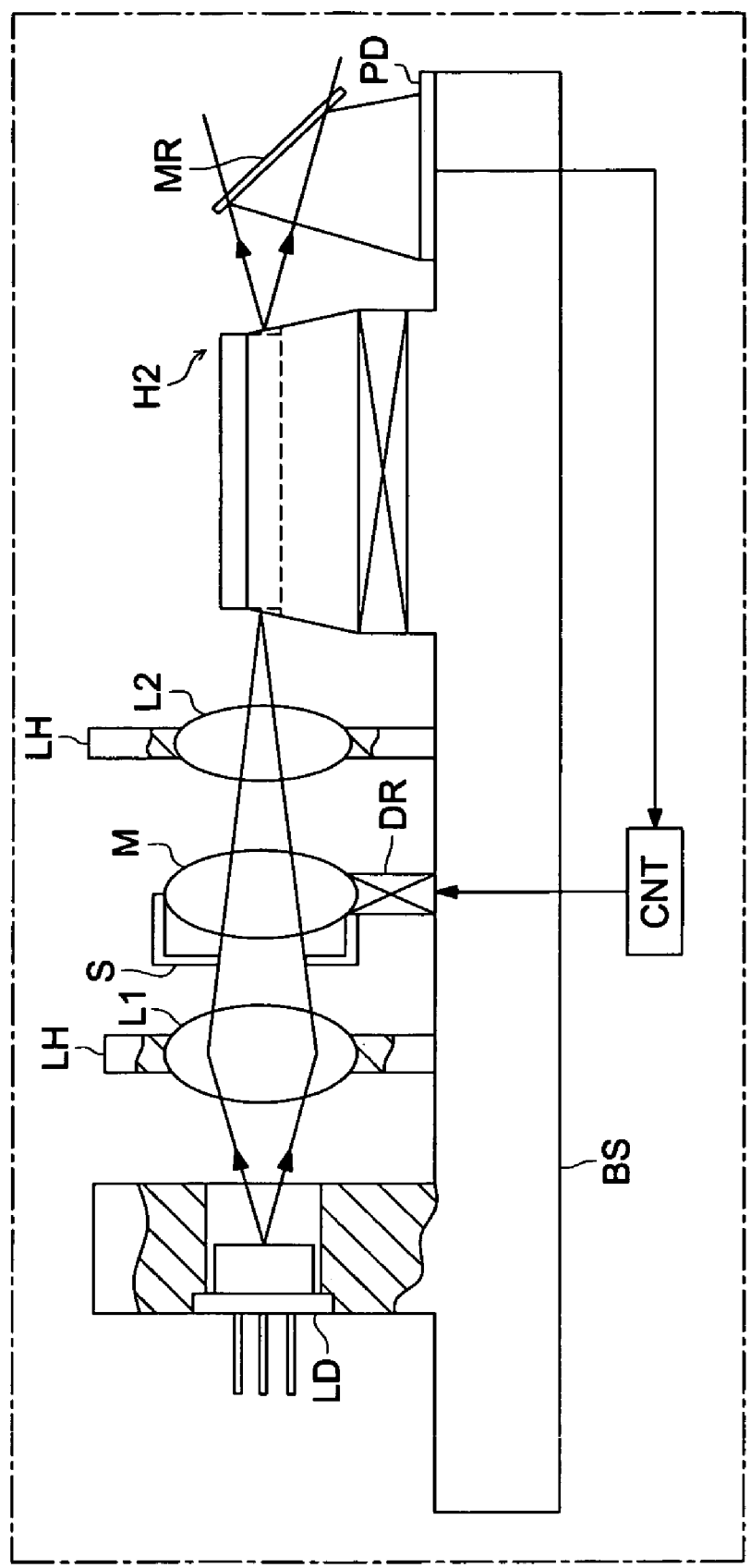
Figure 11:
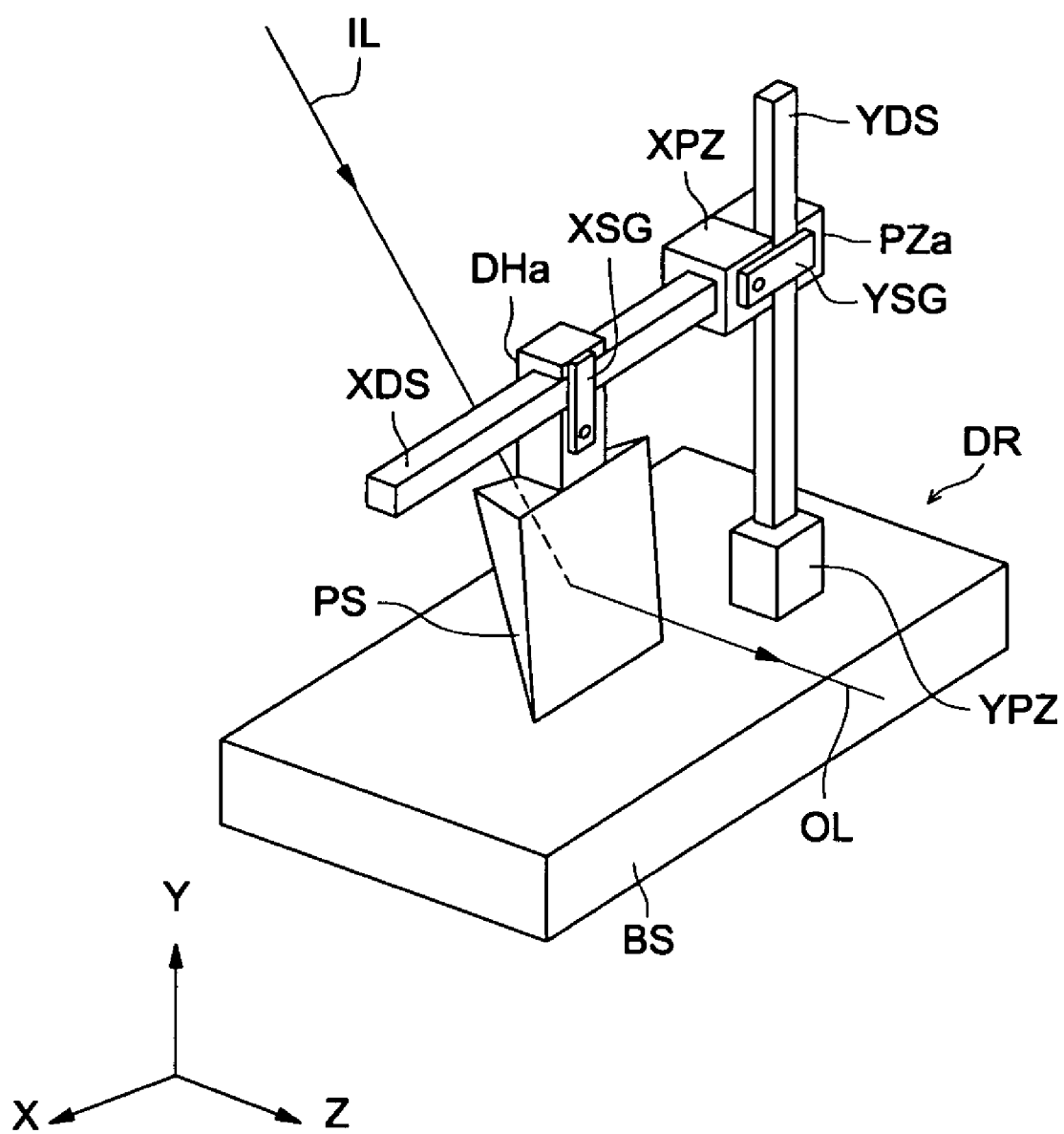

Each of FIGS. 5(a) and 5(b) is a diagram representing a waveform of a voltage pulse applied to the piezoelectric actuator PZ;

FIG. 6 is a diagram representing an example of the coupling efficiency of a SHG element;

FIG. 7 is a diagram schematically representing a light receiving surface of a light receiving element PD;

FIGS. 8(a) through 8(c) are diagrams showing a modified example of the light receiving element PD;

FIG. 9 is a schematic configuration diagram of a semiconductor light source module according to a second embodiment;

FIG. 10 is a schematic configuration diagram of a semiconductor light source module according to a third embodiment;

FIG. 11 is a diagram representing a modified example of an optical element; and

Figure 12:
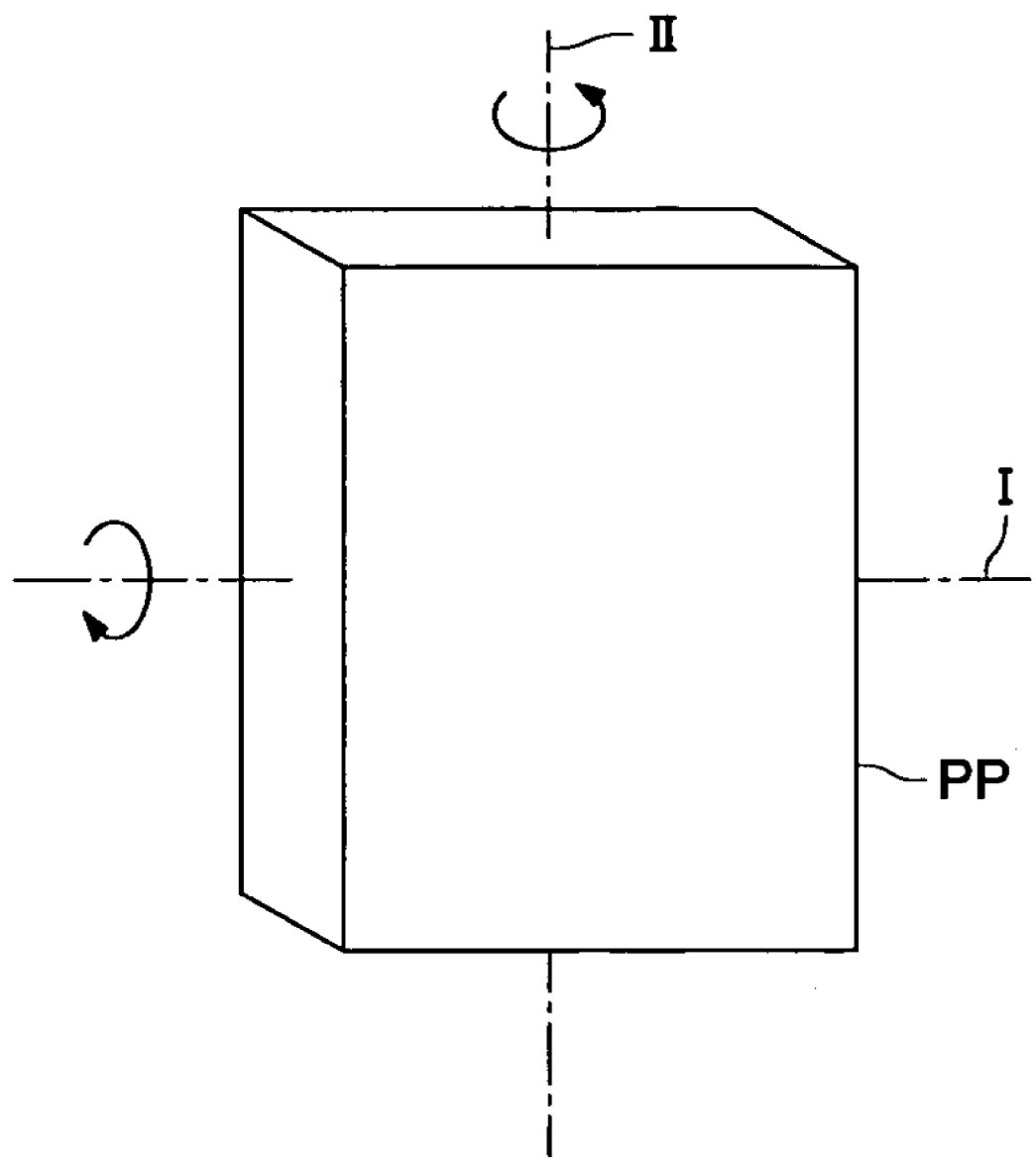

FIG. 12 is a diagram representing another modified example of an optical element.

DESCRIPTION OF THE PREFERRED EMBODIMENT

The preferred embodiments according to the present invention are described below.

Item 1 is a semiconductor light source module including: a semiconductor light source for emitting a light flux with a predefined wavelength; a SHG element for converting an incident light flux entering onto an incident end surface of the SHG element into an outgoing light flux having a different wavelength from the incident light flux; a light converging optical system for converging a light flux emitted from the semiconductor light source onto the incident end surface of the SHG element, comprising at least one optical element; a light receiving element for receiving a part of a light flux emitted from the SHG element; and a drive device for driving an optical element in the light converging optical system based,on a light flux received by, the light receiving element. This structure is designed to receive a part of a light flux emitted from the SHG element and to drive an optical element in the light converging optical system by a drive device based on a light flux received by the light receiving element. Therefore, the structure does not affect a wavelength conversion which is the primary function of the SHG element, and converges a laser light flux from the semiconductor light source on an incident end surface accurately, and the structure copes with aging deterioration, and further provides easy adjustment for assembling operation.

Item 2 is the semiconductor light source module described in Item 1 in which the drive device drives the optical element in the light converging optical system for moving a position of a beam spot formed by the light converging optical system. This structure accurately converges the laser light flux which has passed through the optical element to the end of the SHG element.

Item 3 is the semiconductor light source module described in Item 1 in which the light converging optical system comprises a plurality of optical elements, and the drive device drives at least one of the plurality of optical elements. Therefore, it provides the structure provided at a low cost.

Item 4 is the semiconductor light source module described in Item 3 in which the drive device drives one of the plurality of optical elements of the light converging optical system. Therefore, the configuration of the drive device is simplified and the structure is provided at a much lower cost.

Item 5 is the semiconductor light source module described in Item 3 in which the drive device drives two or more of the plurality of optical elements of the light converging optical system.

Item 6 is the semiconductor light source module described in item 1 in which the drive device derives an optical element in the light converging optical element in at least one direction perpendicular to an optical axis-of the semiconductor light source. This structure allows to correct a shift of a focusing position due to a temperature change, and provides an easy initial regulation.

Item 7 is the semiconductor light source module described in Item 1 in which the drive device drives an optical element in the light converging optical element in one direction perpendicular to an optical axis of the semiconductor light source.

Item 8 is the semiconductor light source module described in Item 1 in which the drive device drives an optical element in the light converging optical element in two directions independently including: a X-axis direction perpendicular to an optical axis of the semiconductor light source; and a Y-axis direction perpendicular to the X-axis direction and the optical axis of the semiconductor light source. When this structure provides a plurality of optical elements, there may be provided a structure in which the drive device drives one optical element in X direction perpendicular to the optical axis and drives the other optical element in Y direction perpendicular to the optical axis and the X direction.

Item 9 is the semiconductor light source module described in item 1 in which the drive device drives an optical element in the light converging optical element in a direction of an optical axis of the semiconductor light source.

Item 10 is the semiconductor light source module described in item 1 in which the drive device includes: an electromechanical transducer; a drive member fixed on one end of the electromechanical transducer; and a movable member connected to an optical element in the light converging optical element and movably supported on the drive member. The electromechanical transducer moves the movable member by repeatedly expanding and contracting at different speed between an expansion and a contraction.

When providing driving operation by the aforementioned electromechanical transducer as a drive device, the aforementioned electromechanical transducer is deformed to slightly expand and contract by applying a drive voltage such as a pulse in serrated waveform for an extremely short-term. The shape of the pulse changes the speed of expansion and contraction. Further, when the aforementioned electromechanical transducer is deformed at a high speed in the direction of expansion or contraction, the aforementioned movable member remains at the current position, without following the operation of the aforementioned drive device due to the inertia of the mass. In the meantime, when the aforementioned electromechanical transducer is deformed in the opposite direction at a lower speed, the aforementioned movable member travels by following the operation of the drive device with the frictional force working during this period. Thus, the aforementioned movable member can be moved continuously in one direction by providing the aforementioned electromechanical transducer expanding and contracting repeatedly. When the action based on this frictional force is utilized, the light converging optical elements connected to the electromechanical transducer can be positioned at the current point by turning off the drive voltage to the electromechanical transducer and the structure is simplified because of reducing a complicated fixing structure.

Further, heat generation at the time of driving can be much reduced as compared to the cases where another drive device, e.g. a voice coil is used for driving, and downsizing of the entire apparatus can be achieved. Such advantages are provided.

Item 11 is the semiconductor light source module described in Item 10 in which the drive member comprises a rotation inhibitor. Therefore, any additional member for guiding the movement of the optical element driven by the drive device is not required for the structure and it makes the structure compact.

Item 12 is the semiconductor light source module described in Item 11 in which the rotation inhibitor is formed of a rectangular cross section of the drive member and the movable member having a shape corresponding to the cross section of the drive member.

Item 13 is the semiconductor light source module described in Item 1 in which the drive device stops driving an optical element in the light converging optical system when an amount of a light flux received by the light receiving element exceeds a predefined value. The structure forms a spot light at a most suitable position and regulates the position more accurately.

Item 14 is the semiconductor light source module described in Item 1 in which the light receiving element comprises a light receiving section receiving a light flux emitted from the SHG element whose wavelength is not converted by the SHG element. This structure reduces a loss caused when separating a light flux whose wavelength is converted by the SHG element.

Item 15 is the semiconductor light source module described in Item 1 in which the light receiving element comprises a light receiving section receiving a light flux emitted from the SHG element whose wavelength is converted by the SHG element. The structure accurately measures an amount of a light flux which has passed through the SHG element because the light receiving element directly measures a light flux whose wavelength is converted.

The semiconductor light source module as another preferred embodiment according to the present invention includes: a semiconductor light source emitting a divergent light flux with a predefined wavelength; a light converging optical system converging the divergent light flux emitted by the semiconductor light source; an optical transmission element having an incident aperture where a convergent light flux emitted by the light converging optical system enters into and whose diameter is 1 µm or more and 15 µm or less and emitting a converted light flux after the convergent light flux enters into the optical transmission element; and a light receiving element receiving a part of the converted light flux. In this structure, the optical transmission element is preferably SHG (Second Harmonic Generation) element.

This structure allows the aforementioned light receiving element to receive part of the converted light flux. Therefore, this arrangement ensures more direct, hence, more accurate measurement of the amount of light passing through the optical transmission element, as compared to the case of the indirect measurement wherein the reflected light or the light passing through the optical transmission element is received.

The aforementioned semiconductor light source module may include a drive device for driving an optical element in the light converging element to bend an optical axis of a principal ray of the light flux emitted by the semiconductor light source or to shift an optical axis of a principal ray of the light flux emitted by the semiconductor light source parallel. This structure ensures that the laser light flux having passed through the aforementioned optical element is converged onto the end of the aforementioned optical transmission element with high accuracy by driving the aforementioned optical element based-on the result of measuring the aforementioned light receiving element.

The aforementioned said semiconductor light source module may include a drive device for driving the optical element in the aforementioned light converging optical system in order to move a position of a beam spot formed by the light converging optical system. This structure ensures that the laser light flux having passed through the aforementioned optical element is converged onto the end of the aforementioned optical transmission element with high accuracy by driving the aforementioned optical element based on the result of measuring the aforementioned light receiving element.

In the aforementioned said semiconductor light source module, the aforementioned light converging optical system may include a plurality of optical elements, and the aforementioned drive device may drive at least one of them. This arrangement provides a low-cost structure.

The semiconductor light source module as another preferred embodiment according to the present invention includes: a semiconductor light source emitting a divergent light flux with a predefined wavelength; a light converging optical system comprising a plurality of optical elements and converging the divergent light flux emitted by the semiconductor light source; an optical transmission element having an incident aperture where a convergent light flux emitted by the light converging optical system enters into and whose diameter is 1 µm or more and 15 µm or less and emitting a converted light flux after the convergent light flux enters into the optical transmission element; and a drive device for driving at least one optical element in the light converging element to bend an optical axis of a principal ray of the light flux emitted by the semiconductor light source or to shift an optical axis of a principal ray of the light flux emitted by the semiconductor light source in parallel.

This structure adjusts the laser light flux having passed through the aforementioned optical element so as to be converged onto the end surface of the aforementioned optical transmission element by driving the aforementioned optical element through the aforementioned drive device.

In the aforementioned semiconductor light source module, the aforementioned drive device may drive at least one of the aforementioned plurality of optical elements in order to move a position of a beam spot formed by the light converging optical system.

This structure adjusts the laser light flux having passed through the aforementioned optical element so as to be converged onto the end surface of the aforementioned optical transmission element by driving the aforementioned optical element through the aforementioned drive device.

When the aforementioned semiconductor light source module further includes a light receiving element for receiving a part of the aforementioned converted light flux, this arrangement ensures more direct, hence, more accurate measurement of the amount of light passing through the optical transmission element, as compared to the case of the indirect measurement wherein the reflected light or the light passing through the optical transmission element is received.

In the aforementioned preferred embodiments according to the present invention, each of the aforementioned plurality of optical elements may have a positive refractive power or a refractive power of zero, and each of the optical elements having the positive refractive power may have a different refractive power each other. This arrangement reduces the change amount of the spot light position with respect to the amount of the drive of the aforementioned optical element and ensures high-precision positioning. When the optical element closest to the aforementioned optical transmission element is driven to move the spot light position, it is possible to minimize the reduction in the optical coupling efficiency to the aforementioned optical transmission element with respect to the deviation from a predetermined position of the aforementioned optical element.

In these embodiments, when the refractive power of the optical element closest to the aforementioned semiconductor light source is greater than that of the optical element closest to the aforementioned optical transmission element, the change amount of the spot light position is reduced with respect to the amount of drive of the aforementioned optical element. This ensures high-precision positioning. Further, when the optical element closest to the aforementioned optical transmission element is driven to move the spot light position, it is possible to minimize the reduction in the optical coupling efficiency to the aforementioned optical transmission element with respect to the deviation from a predetermined position of the aforementioned optical element.

In the aforementioned structures, when the light flux from the semiconductor light source is collimated to approximately parallel light by the optical element closest to the aforementioned semiconductor light source, the amount of driving of the optical element closest to the aforementioned optical transmission element becomes equal to the change amount of the spot light position, with the result that high-precision positioning is ensured by providing the optical element closest, for example, to the aforementioned semiconductor light source converting the divergent light flux emitted from the aforementioned semiconductor light source into approximately parallel light flux, and the optical element closest to the aforementioned optical transmission element converting the approximately parallel light flux to a convergent light flux. Further, when the optical element closest to the aforementioned optical transmission element is driven to move the spot light position, it is possible to minimize the reduction in the optical coupling efficiency to the aforementioned optical transmission element with respect to the deviation from a predetermined position of the aforementioned optical element.

When providing a structure in which the collimated light flux is converged into the aforementioned optical transmission element by one light converging element, a low cost and compact configuration can be achieved.

When the aforementioned one converging element further includes an aperture limiting stop as one body, it is possible to cut off the unwanted light that does not pass through the aforementioned optical transmission element.

When providing a structure in which the aforementioned collimated light flux is converged onto the aforementioned optical transmission element through two light converging elements, the change amount of the spot light position can be reduced with respect to the amount of drive of the aforementioned optical element. This arrangement ensures high-precision positioning. When assuming, for example, that the focal length of the first optical element is F, the focal length of the second optical element is f, the spot light position displacement is $\delta$, and the traveling amount during the aforementioned first optical element is driven is $\Delta$, then, $\delta/\Delta = f/F$ is obtained. When the value of the expression is less than 1, the displacement of the optical element is reduced with respect to the displacement of the spot position, as compared to the case where the aforementioned collimated light flux is converged onto the aforementioned optical transmission element only through one optical element. This ensures high-precision positioning.

The aforementioned semiconductor light source module may satisfy the following conditional expression, where f is a focal length of the optical element driven by the drive device and L is a distance from an emitting end of the semiconductor light source to an emitting end of the optical transmitting element.

$$0.18 \leq f/L \leq 0.45 \quad (1)$$

In the conditional expression (1), the focal length of the aforementioned optical element driven by the aforementioned drive device is assumed as "f" to define the adequate relationship between the focal length f and the distance L from an emitting end of the semiconductor light source to an emitting end of the aforementioned optical transmission element. When the value f/L exceeds the lower limit of the conditional expression (1), it is possible to ensure a greater range for spot correction tolerance. When the f/L is below the upper limit of the conditional expression (1), a sufficient length of the optical transmission element is ensured to improve the SHG element conversion efficiency.

Further, in the aforementioned semiconductor light source module, the aforementioned optical element may be an anamorphic element. This allows the shape of a light flux from the aforementioned semiconductor light source to be corrected even if the light flux has a non-circular section.

The aforementioned light converging optical system may include a parallel flat plate arranged in the optical path of a convergent light flux of the converging optical system. This arrangement permits the spot light position to be adjusted as desired, by tilting the aforementioned parallel flat plate toward the optical axis.

The aforementioned light converging optical system may also include a prism arranged in an optical path of a convergent light flux whose thicknesses change along different two directions perpendicular to an optical axis of an incident light flux. Accordingly, the spot light position is arbitrary adjusted by displacing the prism in directions perpendicular to the optical axis. Further, optimal displacement direction can be selected according to a layout of the entire optical system, because the displacement direction of the prism is not restricted to the perpendicular direction to the optical axis for the adjustment of the spot position.

In the aforementioned semiconductor light source module, the aforementioned drive device may drive an optical element with a smallest power among the optical elements having different positive power from each other in the plurality of optical elements.

In the aforementioned semiconductor light source module, the aforementioned drive device may rotate the optical element of the aforementioned light converging optical system about the axes perpendicular to the optical axis of the aforementioned semiconductor light source.

Alternatively, the aforementioned drive device may rotate the optical element of the aforementioned light converging optical system about only one axis perpendicular to the optical axis of the aforementioned semiconductor light source.

Alternatively, the aforementioned drive device may rotate the optical element of the aforementioned light converging optical system about the first and second axes which are perpendicular to the optical axis of the aforementioned semiconductor light source and are perpendicular to each other.

In the aforementioned semiconductor light source module, the aforementioned the light receiving element preferably includes a plurality of light receiving section.

In the aforementioned structure, each of the plurality of light receiving section preferably has a fan form, and arranged along a circumferential direction of the light receiving element.

This structure preferably includes four light receiving sections having fan form.

In the aforementioned semiconductor light source module, the drive device may be configured to drive so as to move an optical axis of a principal ray of the converted light flux according to a distortion of the light intensity distribution of the converted light flux calculated by a detected information of the light receiving sections.

In this case, the structure in which the drive device stops when an amount of a received light detected by the light receiving element exceeds a predefined value, may be provided. The structure saves energy.

Alternatively, the aforementioned drive device may be controlled so as to make the amount of the received light detected by the light receiving element becomes maximum, or may be stopped when the amount of the received light becomes maximum. It ensures the spot position to be adjusted at an adequate position.

In this structure, high-precision detection will be achieved when the aforementioned drive device is stopped during the light receiving element detects a received light.

A light converging optical system as a preferable embodiment according to the present invention is provided for guiding a light flux emitted by a semiconductor light source to an optical transmission element with a incident aperture with a diameter being 1 μm or more and 15 μm or less. The light converging optical element includes: lens 1 with a positive power having a surface facing the optical transmission element whose curvature is larger than a surface facing the semiconductor light source of the lens 1; and lens 2 with a positive power having a surface facing the semiconductor light source whose curvature is larger than a surface facing the optical transmission element of the lens 2 and arranged closer position to the optical transmission element than the lens 1. The lens 1 and the lens 2 satisfy the following conditional expressions:

$$0.2 \leq f1/f2 \leq 0.7, \tag{2}$$

where f1 is a focal length of the lens 1 and f2 is a focal length of the lens 2.

In the light converging optical system according to the present invention, an adequate convergent light flux can be entered into the optical transmission element having a small aperture when the conditional expression (2) is satisfied. This improves the light use efficiency.

In the aforementioned light converging optical system, the lens 1 may includes a plane surface facing the semiconductor light source and the opposite surface in an aspheric shape providing a smaller curvature at a farther position from an optical axis on the opposite surface.

A light converging optical system as a preferable embodiment according to the present invention is provided for guiding a light flux emitted by a semiconductor light source to an optical transmission element with a incident aperture with a diameter being 1 μm or more and 15 μm or less. The light converging optical element includes: lens 1 with a positive power having a surface facing the optical transmission element whose curvature is larger than a surface facing the semiconductor light source of the lens 1; lens 2 with a positive power having a surface facing the semiconductor light source whose curvature is larger than a surface facing the optical transmission element of the lens 2 and arranged closer position to the optical transmission element than the lens 1; and lens M arranged between the lens 1 and the lens 2 and having a smaller refractive power than that of the lens 2. The lens 1, the lens 2, and the lens M satisfy the following conditional expressions:

$$0.1 \leq f1/f2 \leq 0.6, \text{ and} \tag{3}$$

$$2 \leq |fM|/f2 \leq 5, \tag{4}$$

where f1 is a focal length of the lens 1, f2 is a focal length of the lens 2, and fM is a focal length of the lens M.

In the light converging optical system according to the present invention, an adequate convergent light flux can be guided to the optical transmission element having a small aperture when the conditional expression (3) is satisfied. This improves the light use efficiency. Further, the accuracy in the adjustment of the spot light position is improved with respect to the amount of driving the optical element when the conditional expression (4) is satisfied.

The present invention provides a semiconductor light source module providing excellent assembling properties, and coping with the environmental variation, thereby improving the light use efficiency.

While the preferred embodiments of the present invention have been described using specific terms, such description is for illustrative purposes only, and it is to be understood that changes and variations may be made without departing from the sprit or scope of the appended claims.

Figure 1:
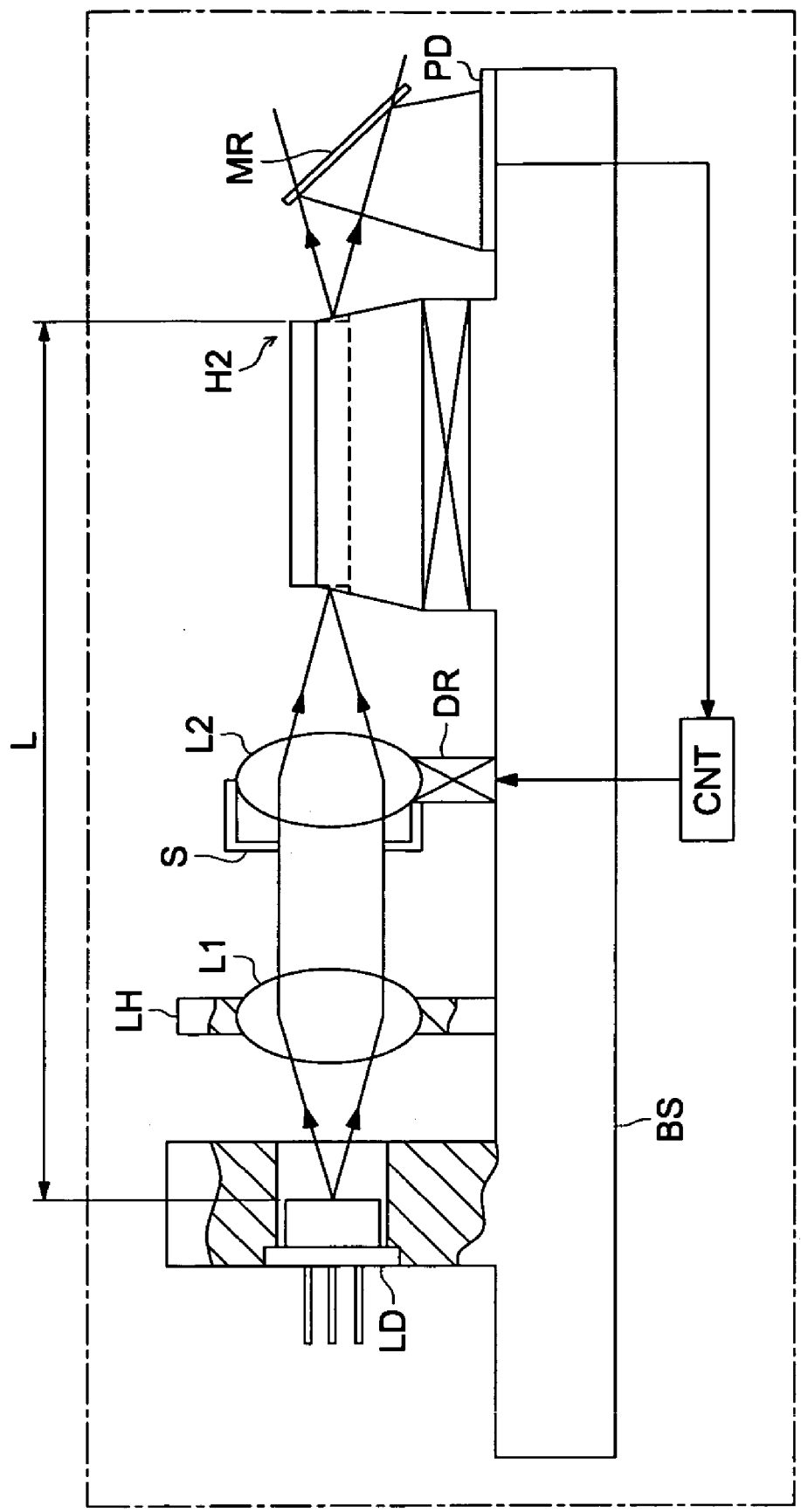
FIG. 1 is a schematic configuration diagram of a semiconductor light source module according to the present embodiment.

Referring to drawings, the following describes the details of the embodiment according to the present invention. FIG. 1 is a schematic configuration diagram of a semiconductor light source module according to the present embodiment. In FIG. 1, there are provided a semiconductor laser LD as a semiconductor light source; a lens L1 on the side of the semiconductor laser LD having a positive refractive power; a second harmonic generation device H2; a half mirror MR for reflecting just a part of the light and transmitting the rest of light; and a light receiving element PD for receiving a light flux reflected from the half mirror MR and transmitting signal to a control circuit CNT in response to the amount of received light, which are fixedly arranged on the base BS. In response to the signal of the. control circuit CNT, the drive mechanism (also called the drive device) DR installed on the base BS drives: the lens L2 arranged on the side of the second harmonic generation device H2 having smaller refractive power than the lens L1; and the aperture stop S in the direction perpendicular to the optical axis. It should be noted that the lens L1 and lens L2 as optical elements form the light converging optical system.

The lens L1 has the surface with its greater curvature facing the side of the optical transmission element opposite the side of the semiconductor laser LD. The lens L2 has the surface with its a greater curvature facing the side of the semiconductor laser LD. The lens L1 is preferably an anamorphic element. Alternatively, the lens 1 also preferably has a plane surface facing the semiconductor laser LD, and an aspherical surface facing the other side whose curvature is reduced as one goes away from the optical axis.

Assuming that the focal length of the lens 1 is f1, and that of the lens 2 is f2, the structure satisfies the following conditional expression:

$$0.2 \leq f1/f2 \leq 0.7. \tag{1}$$

Figure 2:
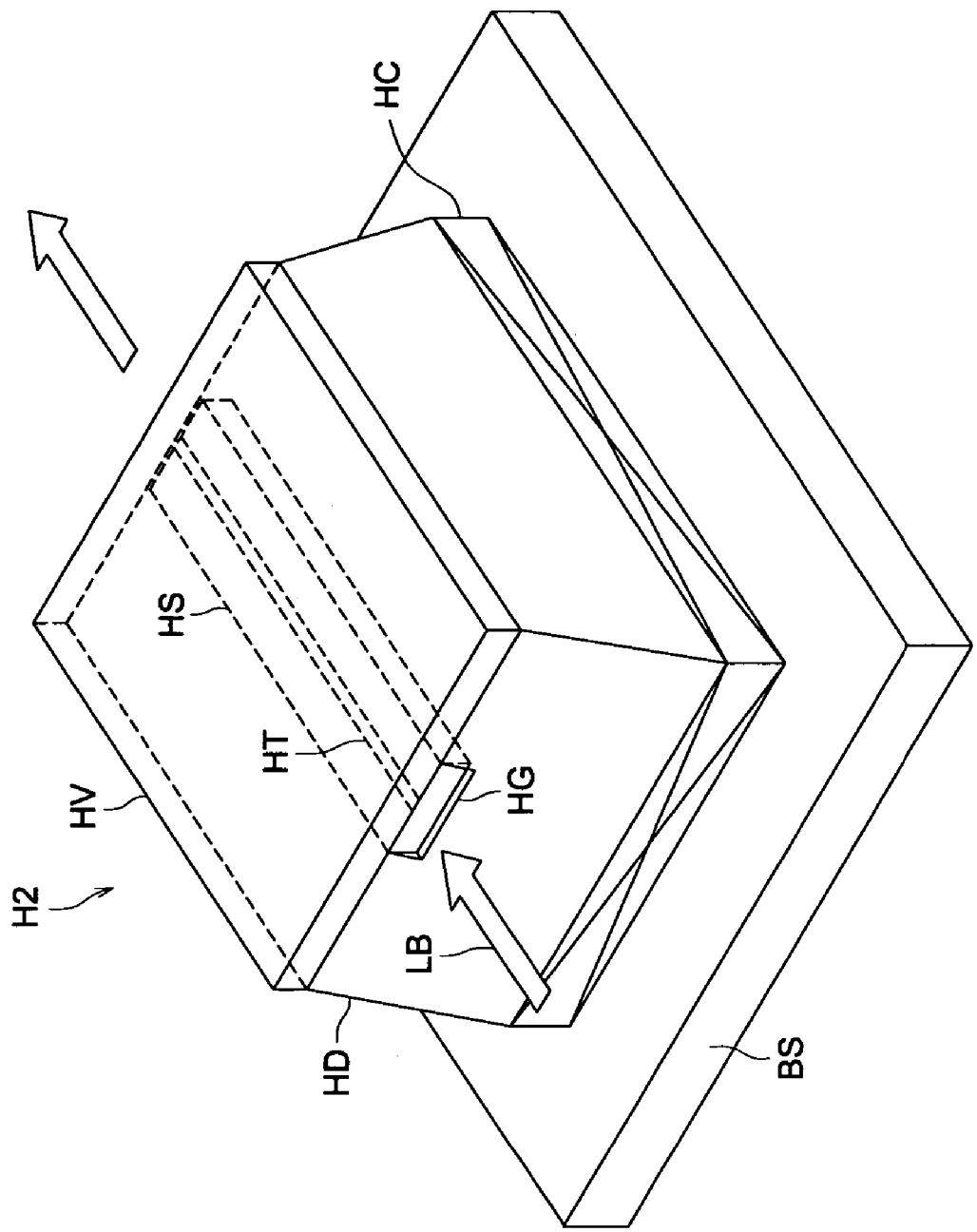
FIG. 2 is a perspective view of a second harmonic generation device H2.

FIG. 2 is a perspective view of a second harmonic generation device H2. As shown in FIG. 2, the second harmonic generation device H2 includes: a thermoelectric cooling device HC mounted on the base BS; an optical waveguide type SHG element HS for generating the second harmonic wave of a laser beam converged by lens L2 and entering into one end of the optical waveguide (also called the optical transmission element) HT; a support member HD for supporting the optical waveguide type SHG element HS; and a cover HV for covering the support member HD in the state of supporting the optical waveguide type SHG element HG. A groove HG for installing the optical waveguide type SHG element HS is formed on the support member HD.

By using a nonlinear optical crystal, the optical waveguide type SHG element HS converts light passing through the optical waveguide HT into the second harmonic wave to output the converted light. This characteristic is described, for example, in the Japanese Non-Examined Patent Publication 2003-223727 and is broadly known, therefore, it will not be described in the present specification in detail. The incident aperture of the optical waveguide HT has a diameter of 1 μm or more and 15 μm or less, where the diagonal length-of the aperture is used for the diameter for rectangular aperture.

Figure 3:
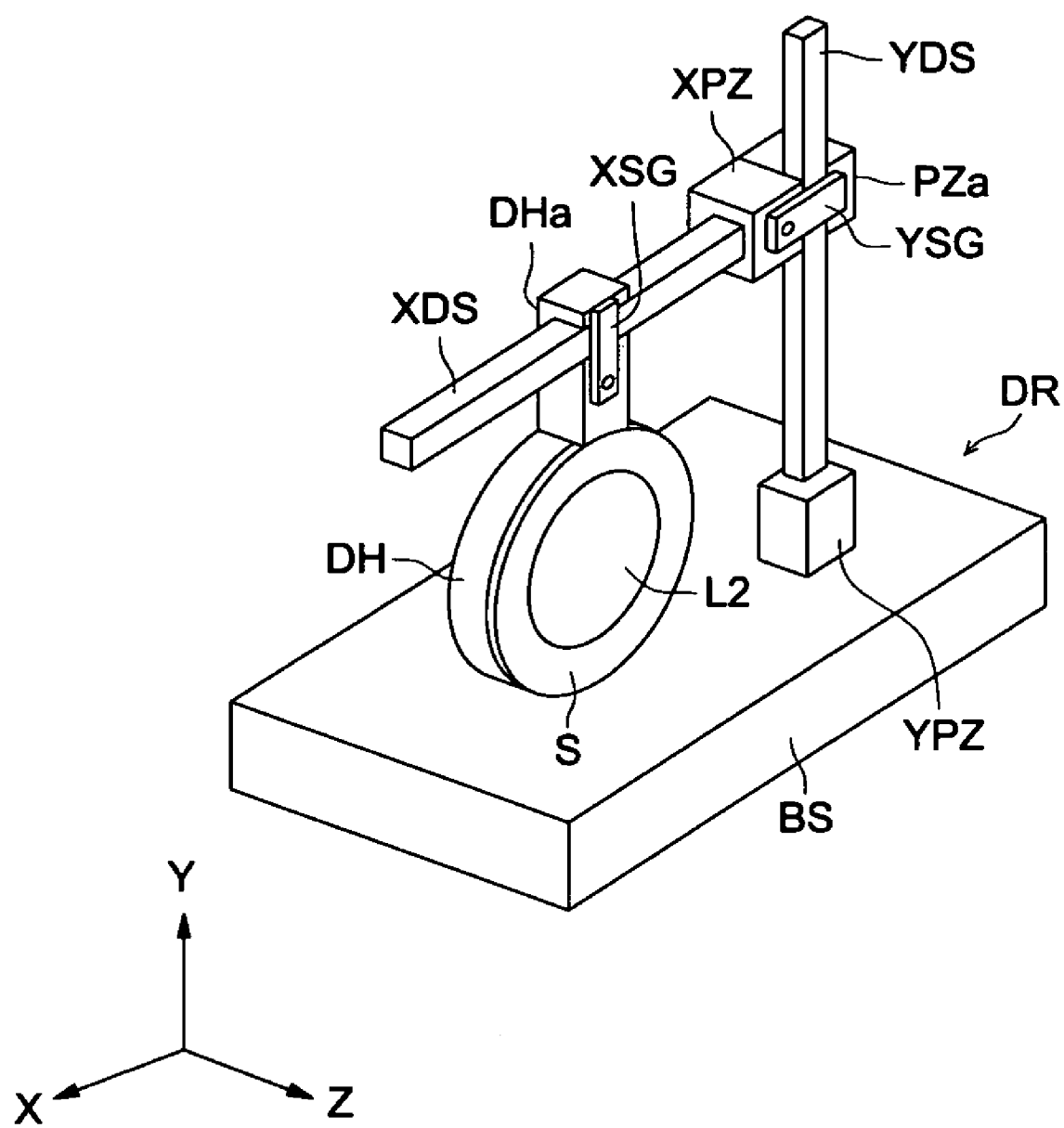
FIG. 3 is a perspective view of a drive device DR.

FIG. 3 is a perspective view of a drive device DR. The lens L2 and aperture stop S are held by a lens holder DH, and moves as one body. The lens holder DH as a movable member has a connection portion DHa for receiving the drive force.

The connection portion DHa is provided with a rectangular groove DHb having a shape corresponding to the X-axis drive shaft XDS of the rectangular columnar and connecting therewith. A plate spring XSG is mounted in such a way that the X-axis drive shaft XDS is sandwiched between the rectangular groove DHb and the plate spring XSG. The X-axis drive shaft XDS as a driving member sandwiched between the connection portion DHa and plate spring XSG extends in the direction (X-axis direction) perpendicular to the optical axis of the lens L2, and is adequately pressed by the energizing force of a plate spring XSG. One end of the X-axis drive shaft XDS is a free end, and the other end is connected to an X-axis piezoelectric actuator XPZ as an electromechanical transducer. The X-axis piezoelectric actuator XPZ contains a connection portion PZa.

The connection portion PZa is provided with a rectangular groove PZb having a shape corresponding to the Y-axis drive shaft YDS of the rectangular columnar and connecting therewith. A plate spring YSG is mounted in such a way that the Y-axis drive shaft YDS is sandwiched between the rectangular groove PZa and the plate spring YSG. The Y-axis drive shaft YDS as a driving member sandwiched between the connection portion PZa and plate spring YSG extends in the X-axis direction perpendicular to the optical axis of the lens L2, and is adequately pressed by the energizing force of a plate spring YSG. One end of the Y-axis drive shaft YDS is a free end, and the other end is connected to a Y-axis piezoelectric actuator YPZ as an electromechanical transducer. The Y-axis piezoelectric actuator YPZ is mounted on the base BS. The drive device DR is made up of the piezoelectric actuators XPZ and YPZ, the drive shafts XDS and YDS, the connection portions DHa and PZa, and the plate springs XSG and YSG.

Figure 4:
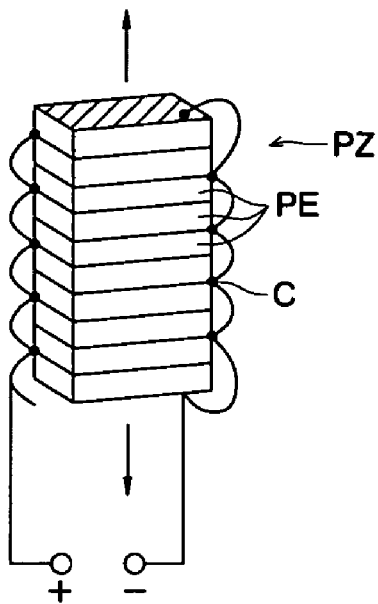
FIG. 4 is a perspective view of a multilayer piezoelectric actuator PZ designed in such a structure that a plurality of piezoelectric ceramics PE are laminated and electrodes C are connected in parallel between these ceramics.

The piezoelectric actuators XPZ and YPZ are made up of a lamination of piezoelectric ceramics formed of PZT (lead zirconate titanate) and others. The piezoelectric ceramic has not agreement between the gravity center of positive charge inside the crystal lattice and that of negative charge, and is polarized per se. The piezoelectric ceramic tends to extend when voltage is applied in the direction of polarization. However, the distortion of the piezoelectric ceramic in this direction is very small and the driven member cannot easily be driven by this distortion. Thus, a. multilayer piezoelectric actuator is proposed as a commercially available product. As shown in FIG. 4, this is a lamination of a plurality of piezoelectric ceramics PE is formed and an electrode C is connected in parallel between these ceramics. In the present embodiment, this multilayer piezoelectric actuator PZ is adopted as a drive source.

The following describes the method of driving this lens L2. Generally, the multilayer piezoelectric actuator exhibits a small amount of displacement when voltage is applied. However, its generation power is great and response is sharp. Accordingly, when an approximately serrated waveform pulse voltage of quick rise and slow fall is applied to the piezoelectric actuator XPZ, as shown in FIG. 5(a), the piezoelectric actuator XPZ exhibits an abrupt expansion at the time of pulse rise, and an slower contraction at the time of pulse fall. Thus, at the expansion of the piezoelectric actuator XPZ, the X-axis drive shaft XDS is pushed out toward the foreground of FIG. 3 by its impact force. The connection portion DHa of the lens holder DH holding the lens L2 and the plate spring XSG are not moved together with the X-axis drive shaft XDS by its inertia, and stay in that position (moves very little in some cases) due to a slip occurring between them and the X-axis drive shaft XDS. In the meantime, the X-axis drive shaft XDS returns more slowly at the time of pulse fall than at the time of pulse rise. The connection portion DHa and plate spring XSG do not slip with respect to the X-axis drive shaft XDS, and move toward the background in FIG. 3, with integrated with the X-axis drive shaft XDS as one body. To be more specific, the lens holder DH holding the lens L2 and aperture stop S can be moved in the X-axis direction at a desired speed on a continuous basis by application of the pulse whose frequency is set at a few hundred Hertz through tens of thousands of Hertz. As is apparent from the above description, as shown in FIG. 5(b), the lens holder DH can be moved in the reverse direction by application of a pulse of slow voltage rise and quick fall. In the present embodiment, the X-axis drive shaft XDS is manufactured in the shape of a rectangular column (locking mechanism or rotation inhibitor). Thus, the rotation inhibiting function of the lens holder DH is activated to control the tilt of the lens L2. This eliminates the need of installing a separate guide shaft.

Similarly, when an approximately serrated waveform pulse voltage of quick rise and slow fall is applied to the piezoelectric actuator YPZ, as shown in FIG. 5(a), the piezoelectric actuator YPZ exhibits an abrupt expansion at the time of pulse rise, and an slower contraction at the time of pulse fall. Thus, at the expansion of the piezoelectric actuator YPZ, the Y-axis drive shaft YDS is pushed out upward in FIG. 3 by its impact force. The connection portion PZa of the piezoelectric actuator XPZ and the plate spring YSG are not moved together with the Y-axis drive shaft YDS by its inertia, and stay in that position (moves very little in some cases) due to a slip occurring between them and the Y-axis drive shaft YDS. In the meantime, the Y-axis drive shaft YDS returns more slowly at the time of pulse fall than at the time of pulse rise. The connection portion PZa and plate spring YSG do not slip with respect to the Y-axis drive shaft YDS, and move downward in FIG. 3, with integrated with the Y-axis drive shaft YDS as one body. To be more specific, the piezoelectric actuator XPZ together with the lens holder DH can be moved in the Y-axis direction at a desired speed on a continuous basis by application of the pulse whose frequency is set at a few hundred Hertz through tens of thousands of Hertz. As is apparent from the above description, as shown in FIG. 5(b), the piezoelectric actuator XPZ together with the lens holder DH can be moved in the reverse direction by application of a pulse of slow voltage rise and quick fall. In the present embodiment, the Y-axis drive shaft YDS is manufactured in the shape of a rectangular column (locking mechanism or rotation inhibitor). Thus, the rotation ingibiting function of the piezoelectric element XPZ is activated to control the tilt of the lens L2. This eliminates the need of installing a separate guide shaft.

FIG. 6 is a diagram representing an example of the coupling efficiency of an SHG element. Generally, the amount of the laser light flux has a Gaussian distribution wherein the center is maximized. This requires alignment between the principal ray of the laser light flux and the center of the optical transmission element of the SHG element. Otherwise, the coupling efficiency will be reduced. Here, when the coupling efficiency is assumed as 100% in the structure that the principal ray of the laser light flux and the center of the optical transmission element of the SHG element are aligned. When the lens in the structure is shifted from the aligned condition, the coupling efficiency is reduced, as shown in FIG. 6, because it causes the misalignment between the principal ray and the center of the optical transmission element. Reduction in coupling efficiency depends on the focal length f of the lens. To be more specific, when the focal length f of the lens is reduced, the coupling efficiency of the SHG element is much reduced in conformity to the displacement of the spot position, as can be seen. In other words, reduction in the focal length f reduces the range of lens shift tolerance.

FIG. 7 is a diagram schematically representing the light receiving surface of a light receiving element PD. As shown in FIG. 7, the light receiving surface of the light receiving element PD is formed of fan-shaped light receiving sections PDa, PDb, PDc, PDd wherein a circle is split in four pieces (i.e., arranged along the circumferential direction). Therefore, the signal (detected information) coming from the light receiving element PD includes four signals depending on the amount of light received by the sections. In FIG. 7, the spot light SB forms an image in the hatched area. The contour line shows the distribution wherein the intensity of light is reduced as one goes away from the center of the light intensity peak area LMX at the middle position toward the periphery.

The following describes the operation of the semiconductor light source module of the present embodiment.

When a laser light flux having a wavelength λ is emitted from the semiconductor laser LD, the laser light flux is converted into the approximately parallel light flux by the first lens L1, and passes through the aperture stop S, then is converged by the second lens L2 to enters into the optical transmission element of the second harmonic generation device H2. In the second harmonic generation device H2, the light flux is converted into the second harmonic wave. In other words, the converted light flux having half the original wavelength (2/λ) is emitted from the second harmonic generation device H2, and a part of the converted light flux is reflected by the half mirror MR. The remainder is outputted to the outside.

The converted light flux reflected by the half mirror MR enters the light receiving surface of the light receiving element PD. In this situation, the center of the light receiving surface of the light receiving element PD corresponds to the center of the optical transmission element. Therefore, when the principal ray of the incident light flux has passed through the center of the optical transmission element, the spot light SB forming an image on the light receiving surface is aligned with the light receiving surface, with the result that the coupling efficiency is maximized. By contrast, when the principal ray of the incident flux fails to pass through the center of the optical transmission element, the spot light SB is misaligned with the center of the light receiving surface, as shown in FIG. 7. Thus, the lens L2 is driven to bend the optical axis of the principal ray of the incident light flux or to cause parallel shift in such a way that the center of the spot light SB agrees with that of light receiving surface.

This will be described more specifically with reference to the control mode: In the state illustrated in FIG. 7, it can be seen that the amount of received light of the light receiving section PDa is the greatest. The control circuit CNT drives the drive device DR to drive the lens L in the X-axis direction. Then the light intensity peak-area LMX of the spot light SB moves in response thereto, with the result that the amount of received light of the light receiving section PDb is increased. When the amount of received light of the light receiving section PDa has reached the level approximately equal to the amount of received light of the light receiving section PDb, the drive of the drive device DR is suspended, so that the lens L2 is kept still. Under this condition, when there is any difference between the amount of received light of the light receiving section PDc and the amount of received light of the light receiving section PDd, the lens L2 is driven in the Y-axis direction so that they will be approximately equal to each other. Then light intensity peak area LMX of the spot light SB is moved in response thereto, and the amount of received light of the light receiving section PDa and the amount of received light of the light receiving section PDb become approximately equal to each other. At the same time, the amount of received light of the light receiving section PDc and the amount of received light of the light receiving section PDd become approximately equal to each other. Then it can be determined that the light intensity peak area LMX of the spot light SB and the center of the light receiving surface are aligned with each other. To improve the detection accuracy, it is preferred that the lens L2 should not be driven when the light receiving element PD is detecting the amount of received light.

FIGS. 8(a) through 8(c) show diagrams of a modified example of the light receiving element PD. In this modified example, the light receiving element PD has a single light receiving section, without the present invention being restricted thereto. The following describes the control mode more specifically. In the state shown in FIG. 8(a), the amount of received light of the light receiving section is low. Therefore, the control circuit CNT drives the drive device DR to move the lens L2 in the X-axis direction. Then as shown in FIG. 8(b), the light intensity peak area LMX of the spot light SB moves in response thereto, and the amount of received light of the light receiving section is increased. If the lens L2 is moved excessively in the X-axis direction, the amount of received light of the light receiving section is again reduced, as shown in FIG. 8(c). This shows that the lens L2 has moved excessively in the X-axis direction. Alternatively, when the lens L2 is driven in the X-axis direction, the amount of received light of the light receiving section is reduced in some cases. In this case, it is possible to detect the position where the amount of received light is maximized, by driving the lens L2 in the direction reverse to X-axis. To improve the detection accuracy, it is preferred that the lens L2 should not be driven when the light receiving element PD is detecting the amount of received light.

The following control method can also be used: When the amount of received light detected by the light receiving element PD has exceeded a predetermined-value, the spot light SB is assumed to have aligned approximately with the light receiving surface, and the lens L2 is not driven. This method saves energy.

When the semiconductor light source module of this embodiment is assembled, semiconductor laser LD is assembled on the base BS, and the light flux emitted therefrom is converted into the parallel light flux through the lens Li held by the lens holder LH. Then they are arranged in a line using an autocollimator or the like to ensure that such a parallel light flux will pass through the optical transmission line of the second harmonic generation device H2. The lens L2 is further mounted on the base BS through the drive device DR. In this case, the connection portions DHa and PZa are placed at the mid-position between the drive shafts XDS and YDS; namely, they are set at the centers of the adjustment positions in each of the X-axis and Y-axis directions. Under this condition, the drive device DR operates in such a way that the amount of received light of the light receiving element PD is maximized. As described with reference to FIGS. 7 and 8(a) to 8(c), fine adjustment can be made merely by driving the lens L2. This initial regulation ensures the maximum correction to be made for alignment, even if a deviation has occurred in any direction of the principal ray of the incoming light flux with respect to the center of the optical transmission line of the second harmonic generation element H2 due to ambient changes or aging changes.

FIG. 9 is a schematic configuration diagram of a semiconductor light source module according to a second embodiment. This embodiment is different from the aforementioned embodiment in that the light converging optical system is made of only one lens L2. Otherwise, the structure and operation are the same as those of the aforementioned embodiment. Accordingly, like parts are designated by the like reference numbers and the description will be omitted.

FIG. 10 is a schematic configuration diagram of a semiconductor light source module according to a third embodiment. This embodiment is different from the aforementioned embodiment in that the light converging optical system is made of only three lenses L1, M and L2. Here only the lens M is displaced by the drive device DR in the X-axis and Y-axis directions. It is also possible to arrange such a configuration that the lens L1 or L2 is driven by the same drive device in the X-axis and Y-axis directions, or the lens M is displaced only in the X-axis direction and the lens L1 or L2 is driven in the Y-axis direction. Otherwise, the structure and operation are the same as those of the aforementioned embodiment. Accordingly, like parts are designated by the like reference numbers and the description will be omitted.

When assuming that the spot position displacement is δ, the traveling amount of optical element is Δ, the focal length of the lens M is F, and the focal length of the second optical element is f, then, $\delta/\Delta = f/F$ is obtained. When the value of the expression is less than 1, the displacement of the optical element is reduced with respect to the displacement of the spot position, as compared to the case where the aforementioned collimated light flux is converged onto the aforementioned optical transmission element only through one optical element. This ensures high-precision positioning.

In the present embodiment, the lens L1 has the surface with its greater curvature facing the side of the optical transmission element opposite the side of the semiconductor laser LD, and the lens L2 has the surface with its a greater curvature facing the side of the semiconductor laser LD. A lens M having a refractive power smaller than the lens 2 is arranged between the lens 1 and lens 2. When assuming that the focal length of the lens 1 is f1, that of the lens 2 is f2, and that of the lens M is fM, then, the structure of the embodiment satisfies the following conditional expressions:

$$0.1 \leq f1/f2 \leq 0.6, \text{ and} \quad (2)$$

$$2 \leq |fM|/f2 \leq 5. \quad (3)$$

In the aforementioned embodiment, the lens L2 or other lenses may be displaced in the optical axis (Z-axis direction) by the similar drive device.

FIG. 11 is a diagram representing a modified example of the optical element. In this modified example, the prism PS instead of the lens L2 is driven by the drive device DR. The prism PS has the thickness being reduced as one goes in the X-axis direction perpendicular to the optical axis, and being increased as one goes in the Y-axis direction perpendicular to the optical axis and X-axis. Accordingly, the optical path of the light flux passing through the prism PS is changed according to the position where the incident light flux IL enters into. Wherefore, the outgoing light flux OL is displaced (shifted in parallel). In other words, displacement of the prism PS in the X-axis or Y- axis direction by the drive device DR makes it possible to make such adjustment that the principal ray of the incident light flux passes through the center of the optical transmission element of the second harmonic generation device H2. It should be noted that the incident light flux IL and outgoing light flux OL are not parallel to each other, and this makes it necessary to ensure that the direction of the semiconductor laser LD is the same as that of the second harmonic generation device H2. It is also possible to arrange such a configuration that a prism having the thickness being reduced as one goes in the X-axis direction perpendicular to the optical axis is driven in the X-axis direction, and the other prism having the thickness being reduced as one goes in the Y-axis direction perpendicular to the optical axis is driven in the Y-axis direction.

FIG. 12 is a diagram representing another modified example of the optical element. A parallel flat plate PP instead of the lens L2 is used in this modified example. When the parallel flat plate PP is rotated about the axis I perpendicular to the optical axis of the semiconductor laser LD and the axis II perpendicular to the optical axis and axis I, the optical path of the light flux passing through the parallel flat plate PP can be changed in conformity to the position where the incident light flux enters into. This causes the outgoing light flux to be displaced (shifted in parallel). To be more specific, the parallel flat plate PP is rotated about at least one of the axis I and axis II by a drive device (not illustrated), whereby adjustment can be made to ensure that the principal ray of the incident light flux passes through the center of the optical transmission element of the second harmonic generation device H2. It is also possible to arrange two parallel flat plates PP so that one of them is rotated around the axis I, and the other is turned about the axis II.

The above has described the present invention with reference to the embodiments thereof, without the present invention being restricted thereto. The present invention can-be embodied in a great number of variations with appropriate modification and improvement. Further, the optical element is displaced in the aforementioned embodiment. It goes without saying, however, that relative displacement of any one of the semiconductor light source, optical element and SHG element is allowed. The light to be detected by the light receiving element can be one of: the light emitted from the optical waveguide (having the same wavelength as that of the semiconductor light source) whose wavelength is not converted by the SHG element; the light whose wavelength is converted by the SHG element (e.g., having half the wavelength of the semiconductor light source); and both of them.

What is claimed is:

1. A semiconductor light source module comprising:
 a semiconductor light source for emitting a light flux with a predefined wavelength;
 a second harmonic generation element for converting an incident light flux entering onto an incident end surface of the second harmonic generation element into an outgoing light flux having a different wavelength from the incident light flux;
 a light converging optical system for converging a light flux emitted from the semiconductor light source onto the incident end surface of the second harmonic generation element, comprising at least one optical element;
 a light receiving element for receiving a part of a light flux emitted from the second harmonic generation element; and
 a drive device for driving an optical element in the light converging optical system based on a light flux received by the light receiving element,
 wherein the drive device drives the optical element in the light converging optical system for moving a position of a beam spot formed by the light converging optical system.

2. The semiconductor light source module of claim 1,
 wherein the light converging optical system comprises a plurality of optical elements, and
 the drive device drives at least one of the plurality of optical elements.

3. The semiconductor light source module of claim 2,
 wherein the drive device drives one of the plurality of optical elements of the light converging optical system.

4. The semiconductor light source module of claim 2,
 wherein the drive device drives two or more of the plurality of optical elements of the light converging optical system.

5. The semiconductor light source module of claim 1, wherein the drive device drives an optical element in the light converging optical element in at least one direction perpendicular to an optical axis of the semiconductor light source.

6. The semiconductor light source module of claim 1, wherein the drive device drives an optical element in the light converging optical element in one direction perpendicular to an optical axis of the semiconductor light source.

7. The semiconductor light source module of claim 1, wherein the drive device drives an optical element in the light converging optical element in two directions independently including: a X-axis direction perpendicular to an optical axis of the semiconductor light source; and a Y-axis direction perpendicular to the X-axis direction and the optical axis of the semiconductor light source.

8. The semiconductor light source module of claim 1, wherein the drive device drives an optical element in the light converging optical element in a direction of an optical axis of the semiconductor light source.

9. The semiconductor light source module of claim 1, wherein the drive device comprises:
an electromechanical transducer;
a drive member fixed on one end of the electromechanical transducer; and
a movable member connected to an optical element in the light converging optical element and movably supported on the drive member, and
the electromechanical transducer moves the movable member by repeatedly expanding and contracting at different speeds between an expansion and a contraction.

10. The semiconductor light source module of claim 9, wherein the drive member comprises a rotation inhibitor.

11. The semiconductor light source module of claim 10, wherein the rotation inhibitor is formed of a rectangular cross section of the drive member and the movable member having a shape corresponding to the cross section of the drive member.

12. The semiconductor light source module of claim 1, wherein the drive device stops driving an optical element in the light converging optical system when an amount of a light flux received by the light receiving element exceeds a predefined value.

13. The semiconductor light source module of claim 1, wherein the second harmonic generation element emits the outgoing light flux having a different wavelength from the incident light flux and a light flux having a same wavelength as the incident light flux entering onto the incident end surface of the second harmonic generation element, and
the light receiving element comprises a light receiving section receiving the light flux having the same wavelength as the incident light flux.

14. The semiconductor light source module of claim 1, wherein the light receiving element comprises a light receiving section receiving a light flux emitted from the second harmonic generation element whose wavelength is converted by the second harmonic generation element.

* * * * *